(12) United States Patent
Kim et al.

(10) Patent No.: US 8,431,256 B2
(45) Date of Patent: Apr. 30, 2013

(54) COFESIB/PT MULTILAYERS EXHIBITING PERPENDICULAR MAGNETIC ANISOTROPY

(75) Inventors: Young Keun Kim, Seoul (KR); You-Song Kim, Seoul (KR); Byong-Sun Chun, Seoul (KR); Seung-Youb Han, Seoul (KR); Jang-Roh Rhee, Seoul (KR)

(73) Assignee: Korea University Foundation (KR)

( * ) Notice: Subject to any disclaimer, the term of this patent is extended or adjusted under 35 U.S.C. 154(b) by 611 days.

(21) Appl. No.: 11/746,900

(22) Filed: May 10, 2007

(65) Prior Publication Data

US 2008/0124582 A1 May 29, 2008

(30) Foreign Application Priority Data

Nov. 28, 2006 (KR) ........................ 10-2006-0118143

(51) Int. Cl.
*G11B 5/66* (2006.01)
(52) U.S. Cl.
USPC .......................................... 428/827; 428/826
(58) Field of Classification Search ............ 428/827
See application file for complete search history.

(56) References Cited

U.S. PATENT DOCUMENTS

| | | | | |
|---|---|---|---|---|
| 6,815,082 | B2* | 11/2004 | Girt ........................... | 428/828.1 |
| 7,147,941 | B2* | 12/2006 | Futamoto et al. .......... | 428/828.1 |
| 2005/0061658 | A1* | 3/2005 | Lin et al. ..................... | 204/192.2 |
| 2005/0105328 | A1* | 5/2005 | Ho ................................ | 365/158 |

FOREIGN PATENT DOCUMENTS

| | | |
|---|---|---|
| JP | 2002183928 | 6/2002 |
| JP | 2002204010 | 7/2002 |
| JP | 2004-022599 | 1/2004 |
| JP | 2004-179187 | 6/2004 |
| JP | 2004179187 A * | 6/2004 |
| JP | 2005510047 | 4/2005 |
| JP | 2006253637 | 9/2006 |
| JP | 200752847 | 8/2007 |
| KR | 10-0586265 | 5/2008 |

OTHER PUBLICATIONS

Machine Translation of JP 2004-179187 A (Jun. 2004).*
Machine translation of Nagase et al. JP 2004-179187, published Jun. 24, 2004.*
Nishimura et al, "Magnetic tunnel junction device with perpendicular magnetization films for high-density magnetic random access memory", Journal of Applied Physics, Apr. 15, 2007, pp. 5246-5249, vol. 91, No. 8, American Institute of Physics.
Notice of Patent Grant Dated May 27, 2008 in connection with corresponding Korean application.
Japanese Office Action dated Feb. 27, 2009 issued in related Japanese Patent Application No. 2007-111913.
Japanese Decision of Grant dated Aug. 24, 2010 issued in related Japanese Patent Application No. 2007-510047.

* cited by examiner

*Primary Examiner* — Mark Ruthkosky
*Assistant Examiner* — Gary Harris
(74) *Attorney, Agent, or Firm* — Grossman, Tucker, Perreault & Pfleger, PLLC

(57) ABSTRACT

Provided is a magnetic anisotropy multilayer including a plurality of CoFeSiB/Pt layers used in a magnetic random access memory. The magnetic anisotropy multilayer includes a first Pt/CoFeSiB layer, and a second Pt/CoFeSiB layer formed on the first Pt/CoFeSiB layer.

8 Claims, 5 Drawing Sheets

COFESIB/PT MULTILAYERS EXHIBITING PERPENDICULAR MAGNETIC ANISOTROPY

PRIORITY

This application claims priority under 35 U.S.C. §119 to a Korean application filed in the Korean Intellectual Property Office on Nov. 28, 2006 and allocated Serial No. 2006-118143, the contents of which are incorporated herein by reference.

BACKGROUND OF THE INVENTION

1. Field of the Invention

The present invention relates generally to a magnetic anisotropy multilayer used in a magnetic random access memory, and more particularly, to a magnetic anisotropy multilayer including a plurality of CoFeSiB/Pt layers.

2. Description of the Related Art

A magnetic random access memory (hereinafter, referred to as a magnetic memory) is being used in military applications such as a missile, a spacecraft, and the like. The magnetic memory has advantages of volatile devices such as a dynamic random access memory (DRAM) and a static random access memory (SRAM), i.e., both high integration degree of a DRAM and high-speed performance of an SRAM. In addition, the magnetic memory has lower power consumption than a nonvolatile type flash memory, and it has great number of repetition times of record reproduction. Therefore, it is considered as a substitution for the existing memory that has been used in a mobile phone, a computer and a network. Also, attempts are being made to apply the magnetic memory to a radio frequency identification (RFID) tag requiring low price and volatility, and further there is a great likelihood that it can be applied to a robot for factory automation.

The magnetic memory is a magnetic memory device having magnetic tunnel junctions (MTJs) based on tunneling magnetoresistance (TMR). The magnetic memory can input data by using spin directions caused by self-revolution of electrons in the device. In detail, the resistance of the magnetic memory is changed according as the spin directions of adjacent magnetic layers become parallel or anti-parallel, and the spin direction can be controlled to be parallel or anti-parallel by applying a magnetic field from the exterior. By using this property, it is possible to input data in the magnetic memory.

In general, the MTJ is configured in the shape of a sandwich where an insulating layer (generally, $Al_2O_3$ or MgO layer) as a tunneling barrier is interposed between two ferromagnetic layers. A current flows perpendicular to each layer. One of the two ferromagnetic layers is a pinned layer acting as a reference layer and the other one is a free layer for magnetic recording or sensing. In case that the spin directions of the two ferromagnetic layers are parallel with each other when current flows, the resistance becomes small so that the tunneling probability of current becomes great. On the contrary, when the spin directions of the two ferromagnetic layers are anti-parallel, the resistance becomes large, which results in reducing the tunneling probability of current. For ultra high integration of the magnetic memory, it should be necessary to form submicron memory cells. If a unit MTJ shrinks in size and an aspect ratio of the cell is also reduced for achieving the high integration degree of the magnetic memory, multi-domains or a vortex is formed inside a magnetic substance of the MTJ due to strong diamagnetic field. This leads to an unstable cell-switching phenomenon, which decreases a writing margin.

When fabricating the cell with high aspect ratio, such a multi-domain structure is not formed in virtue of shape magnetic anisotropy but it is difficult to achieve high integration. Moreover, this requires high switching magnetic field so that it is impossible to highly integrate the device after all.

To overcome such a problem, a perpendicular magnetic anisotropy MTJ has been developed (Naoki Nishimura et al., J. Appl. Phys., vol. 91, p. 5246. 2002). In Nishimura et al., the MTJ was fabricated using rare-earth and transition-metal alloys such as TbFeCo and GdFeCo, which has been well known as perpendicular magnetic anisotropy material, as a free layer and a pinned layer, respectively. The magnetoresistance ratio of this MTJ was 55%. In addition, it was confirmed that there was no susceptibility distortion at the perpendicular magnetic anisotropy MTJ through a magnetic force microscope (MFM). However, Tb and Gd used in this experiment are disadvantageous in terms of low corrosion resistance and difficulty in property control, and thus it is not easy to put these elements into the practical use. Therefore, for practical use of the perpendicular magnetic anisotropy MTJ (in short, pMTJ), it is necessary to develop new perpendicular magnetic anisotropy material.

The perpendicular magnetic anisotropy layers that have been researched were developed in order that they may be substituted for longitudinal magnetic storage media which will encounter the limitation of high density. The material exhibiting the perpendicular magnetic anisotropy is CoCr-based alloy layer, Co/Pt, or Co/Pd multilayer, wherein this material should meet specific physical properties such as high perpendicular magnetic anisotropy, high coercivity and high remanent magnetization.

However, as the magnetic memory needs rapid switching and low power consumption, low coercivity and high magnetic anisotropy for the increase of a writing margin are required. In addition, it is required to maintain a remanent magnetization to be similar to a saturation magnetization and simultaneously to be low for improving the sensitivity of the magnetic memory switching operation.

In order to employ a perpendicular magnetic tunnel junction (pMTJ) that has been actively researched to meet the demand for high integration of the magnetic memory, the perpendicular magnetic anisotropy layer exhibiting low coercivity, low saturation magnetization and high magnetic anisotropy should be used. That is, the perpendicular magnetic anisotropy MTJ formed of the above-listed perpendicular magnetic anisotropy material, in which the magnetization direction is perpendicular to the layer surface, has low saturation magnetization and no magnetic distortion at an edge of the layer, which will make it possible to realize the high integration of the magnetic memory.

Accordingly, it is required a perpendicular magnetic anisotropy layer having a low coercivity and a low saturation magnetization similar to a remanent magnetization, and capable of minimizing power consumption as well.

SUMMARY OF THE INVENTION

An object of the present invention is to substantially solve at least the above problems and/or disadvantages and to provide at least the advantages below. Accordingly, an object of the present invention is to provide a magnetic anisotropy layer having a low coercivity and a low saturation magnetization or smaller similar to a remanent magnetization.

Another object of the present invention is to provide a CoFeSiB/Pt magnetic anisotropy layer having a low coercivity (20 Oe or smaller) and a low saturation magnetization (172 emu/cm$^3$) similar to a remanent magnetization (squareness≈1).

Further another object of the present invention is to provide a magnetic anisotropy layer configured with CoFeSiB/Pt multilayers having a low coercivity (20 Oe or smaller) and a low saturation magnetization (172 emu/cm$^3$) similar to a remanent magnetization (squareness≈1).

According to one aspect of the present invention, a perpendicular magnetic anisotropy multilayer includes: a first Pt/CoFeSiB layer; and a second Pt/CoFeSiB layer formed on the first Pt/CoFeSiB layer.

According to another aspect of the present invention, a perpendicular magnetic tunnel junction (PMTJ) including a free layer and a pinned layer separated by a non-magnetic spacer layer (tunnel barrier), wherein the free layer includes: a first Pt/CoFeSiB layer; and a second Pt/CoFeSiB layer formed on the first Pt/CoFeSiB layer.

In addition, there may be provided other embodiments having structures different from the above magnetic anisotropy multilayer, or other embodiments realized by modifying and adding elements.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENTS

Preferred embodiments of the present invention will be described herein below with reference to the accompanying drawings. In the following description, well-known functions or constructions are not described in detail since they would obscure the invention in unnecessary detail.

A multi-stacked structure of a perpendicular magnetic anisotropy multilayer according to the present invention is represented as Si/SiO$_2$/Ta/Pt/[Pt/CoFeSiB]×n/Ta, where Si denotes a substrate, SiO$_2$ is a native oxide layer formed on the substrate, and Ta and Pt layers are buffer layers. The other Ta layer is a capping layer. The subject of the present invention is [Pt/CoFeSiB] layer exhibiting perpendicular magnetic anisotropy. That is, the CoFeSiB layer is used in the present invention instead of the Pt/Co or Pt/CoFe layer that was used for the existing perpendicular anisotropy multilayer.

Hereinafter, preferred embodiments of the present invention are intended to provide or will be described in detail with reference to accompanying drawings.

Figure 1:
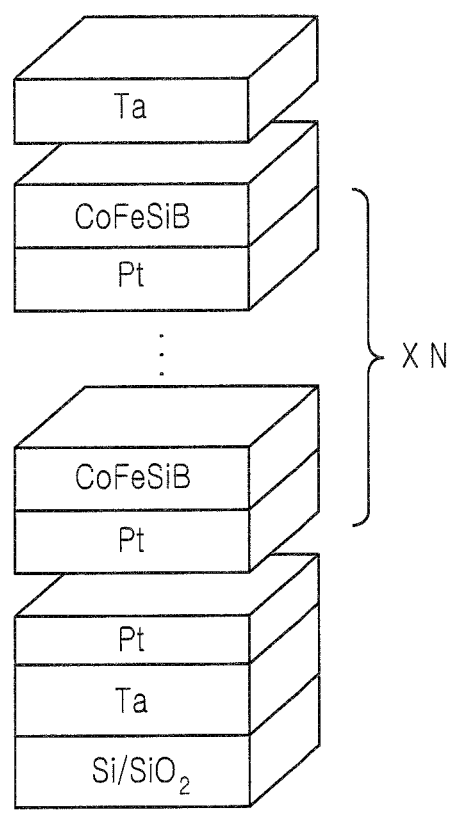
FIG. 1 is a schematic view illustrating a multi-stacked structure of CoFeSiB/Pt perpendicular magnetic anisotropy layer according to the present invention.

FIG. 1 is a schematic view illustrating a multi-stacked structure of CoFeSiB/Pt perpendicular magnetic anisotropy layer formed according to the present invention.

The perpendicular magnetic anisotropy layer of FIG. 1 formed according to one embodiment of the present invention can be expressed as Si/SiO$_2$/Ta 50/Pt 4/[Pt (t$_1$)/CoFeSiB (t$_2$)]×n/Ta 50 in consideration of respective thicknesses, where thickness unit is angstrom. Herein, n denotes the number (i.e., the number of repetition times) of Pt (t$_1$)/CoFeSiB (t$_2$) layers, and t$_1$ and t$_2$ denotes thicknesses of Pt and CoFeSiB, respectively. Further, Si denotes the substrate, and SiO$_2$ layer of which a thickness is considered to be insignificant is an oxide layer formed on the substrate.

Here, the CoFeSiB has a composition of Here, $Co_{84.8}Fe_{5.96}Si_{6.24}B_{3.04}$~$Co_{70.5}Fe_{4.5}Si_{15}B_{10}$ (in atomic percent) where t$_1$, t$_2$ and n are variables that can be variously changed.

A direct current (DC) magnetron sputtering method is used for depositing the multilayer of the present invention, where base pressure is less than 5×10$^{-8}$ Torr. The thickness of the layer is controlled through deposition time. The Pt and CoFeSiB layers are repetitively deposited to thereby form a perpendicular magnetic anisotropy in virtue of surface anisotropy at an interface. According to measurement results of magnetic properties, the coercivity is about 20 Oe, the saturation magnetization is about 170 emu/cm$^3$, and the perpendicular magnetic anisotropy is about 5×10$^5$ erg/cm$^3$~5×10$^6$ erg/cm$^3$, in the layer structure of Si/SiO$_2$/Ta 50/Pt 4/[Pt 8/CoFeSiB 3]×4/Ta 50 (thickness unit: Angstrom). Here, it is preferable that the number of repetition times be 3 or 4. As the number of repetition times increases, the coercivity also increases, which is not preferable.

Figure 2:
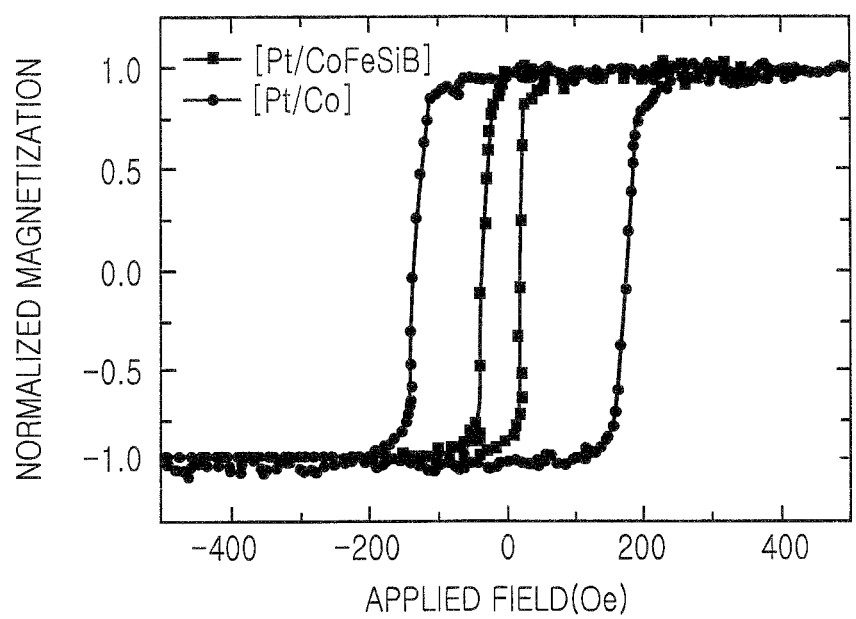
FIG. 2 is a graph illustrating the comparison of magnetic properties between an existing Co/Pt layer and the CoFeSiB/Pt formed according to the present invention.

FIG. 2 is a graph illustrating the comparison of magnetic properties between an existing Co/Pt multilayer and the CoFeSiB/Pt multilayer formed according to the present invention.

More specifically, FIG. 2 is a graph illustrating the comparison results of magnetic properties between the existing [Co/Pt] multilayer and the inventive [CoFeSiB/Pt] multilayer, in which they have the same structure and layer thickness. That is, the layer structure is Si/SiO$_2$/Ta 50/Pt 4/[Pt 8/CoFeSiB or Co 3]×5/Ta 50 (thickness unit: Angstrom), and the magnetic property is measured using a vibrating sample magnetometer (VSM).

According to the results, the [CoFeSiB/Pt] multilayer of the present invention has one-tenth the coercivity and one-third the saturation magnetization of the existing [Co/Pt] multilayer. Thus, when the [CoFeSiB/Pt] multilayer of the present invention is applied to a free layer of pMTJ, it shows good switching characteristic.

Figure 3:
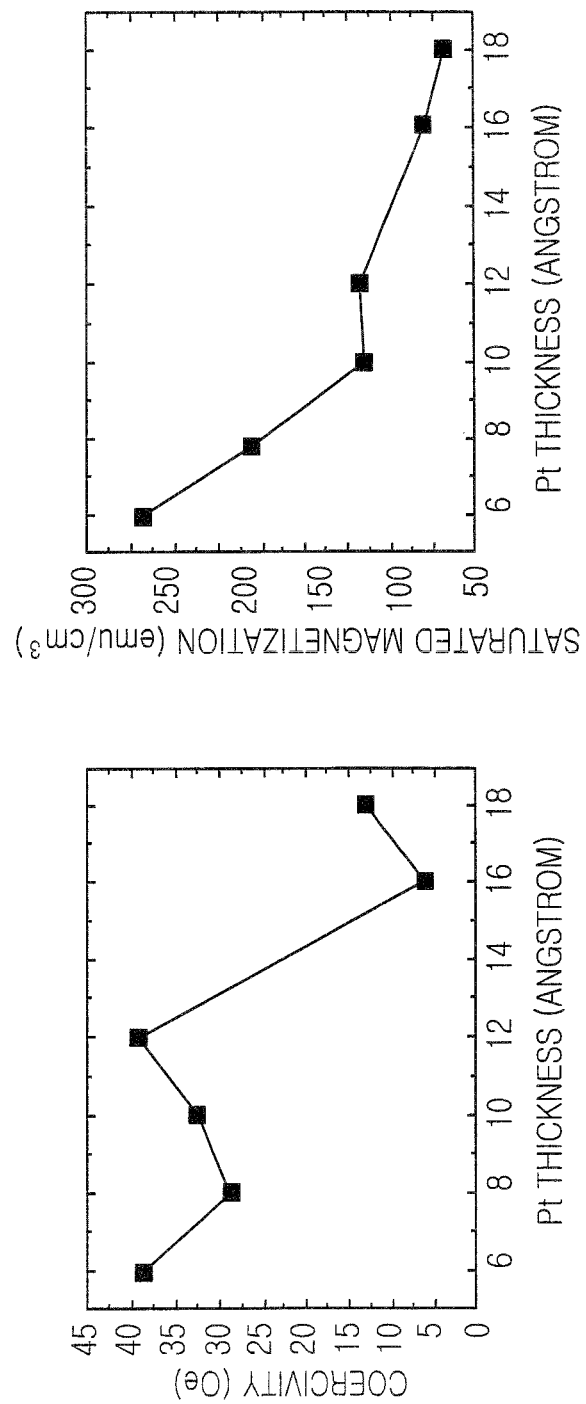
FIG. 3 is a graph illustrating variations of coercivity and saturation magnetization of the multilayer depending on the variation of Pt thickness (t) in Si/SiO$_2$/Ta 50/Pt 4/[Pt (t)/CoFeSiB 3]×5/Ta 50 (thickness unit: Angstrom)

FIG. 3 is a graph illustrating variations of coercivity and saturation magnetization of the multilayer depending on the variation of Pt thickness (t) in the layer structure of Si/SiO$_2$/Ta 50/Pt 4/[Pt (t)/CoFeSiB 3]×5/Ta 50 (thickness unit: Angstrom).

Referring to FIG. 3, it can be understood that the coercivity and the saturation magnetization are varied with the variation of the Pt thickness (t$_1$) in the layer structure of Si/SiO$_2$/Ta 50/Pt 4/[Pt (t)/CoFeSiB 3]×5/Ta 50 (thickness unit: Angstrom). That is, it can be understood that the dipole-interaction between magnetic layers decreases with the increase of the Pt thickness, and particularly, the coercivity is abruptly reduced if the Pt thickness exceeds to 12 Å. In addition, it can be also understood that the saturation magnetization decreases as the Pt thickness increases. It is preferable that the coercivity be less than 20 Oe in order that the multilayer may be used for a perpendicular magnetic tunneling junction (pMTJ).

Figure 4:
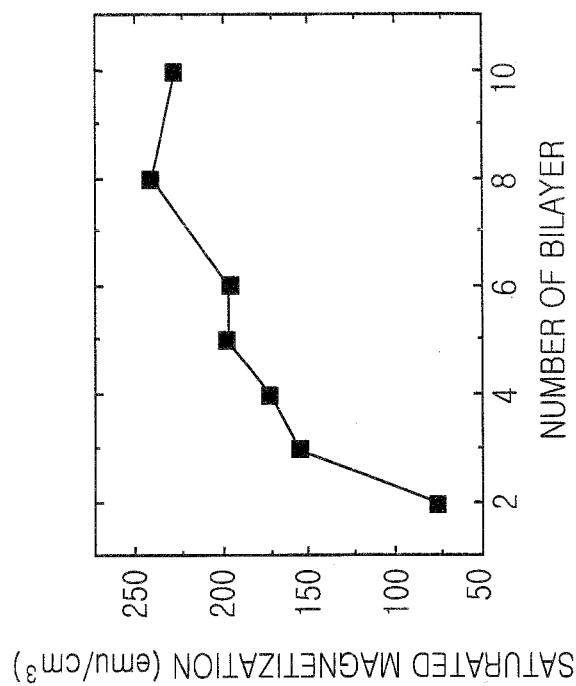
FIG. 4 is a graph illustrating variations of coercivity and saturation magnetization of the multilayer depending on the variation of number of repetition times (n) in Si/SiO$_2$/Ta 50/Pt 4/[Pt 8/CoFeSiB 3]×n/Ta 50 (thickness unit: Angstrom)
Figure 4:
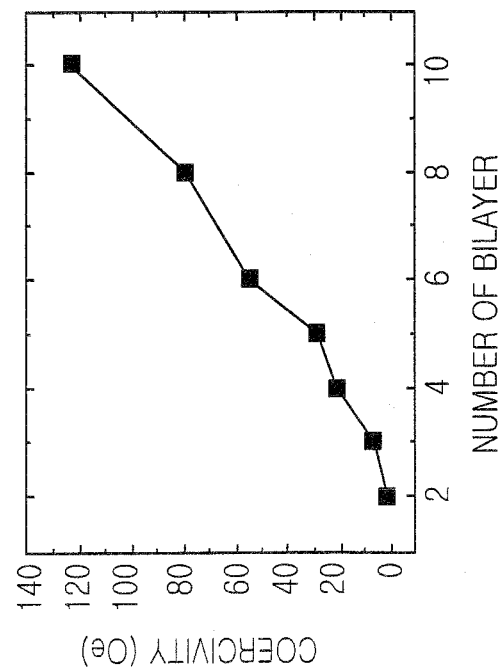

FIG. 4 is a graph illustrating variations of coercivity and saturation magnetization of the multilayer depending on the variation of number of repetition times (n) in the layer structure of Si/SiO$_2$/Ta 50/Pt 4/[Pt 8/CoFeSiB 3]×n/Ta 50 (thickness unit: Angstrom). Predictably, as the number of repetition times increases, it is understood that the coercivity increases and the saturation magnetization increases to a predetermined degree and then becomes constant after a predetermined value. Since the coercivity should be less than 20 Oe in order that the multilayer may be used for the pMTJ, it is preferable that the number of repetition times be 3 or 4.

Figure 5:
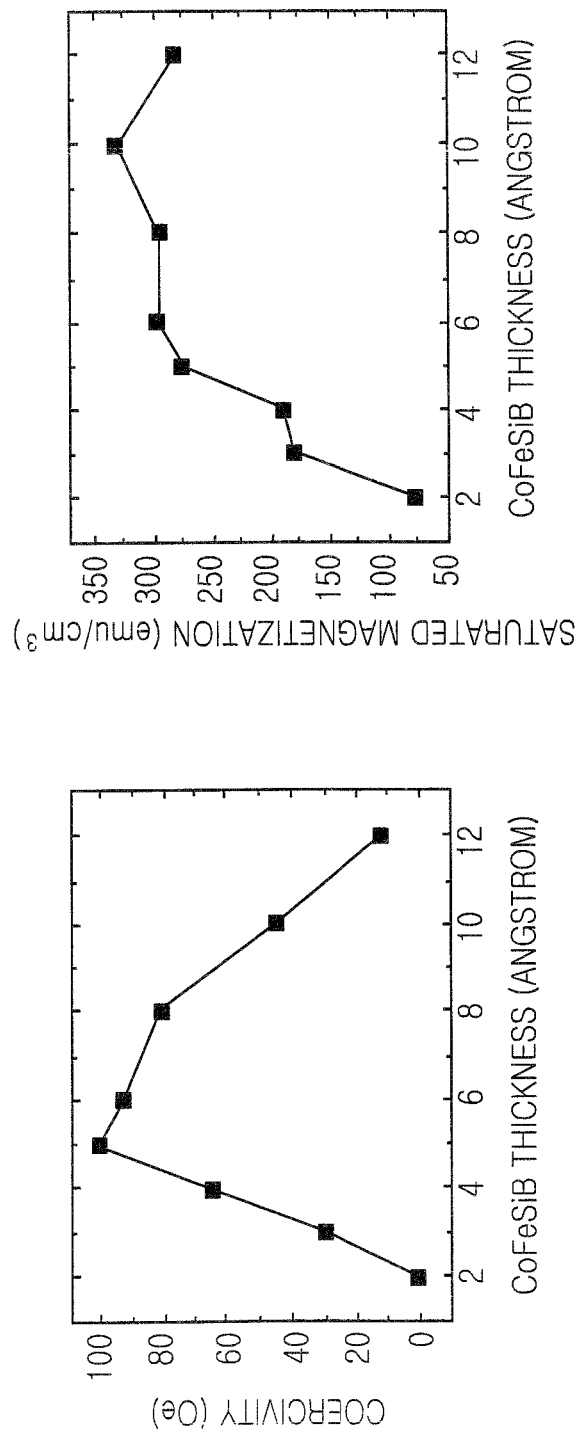
FIG. 5 is a graph illustrating variations of coercivity and saturation magnetization of the multilayer depending on the variation of CoFeSiB thickness (x) in Si/SiO$_2$/Ta 50/Pt 4/[Pt 8/CoFeSiB (x)]×5/Ta 50 (thickness unit: Angstrom).

FIG. 5 is a graph illustrating variations of coercivity and saturation magnetization of the multilayer depending on the variation of CoFeSiB thickness (x) in Si/SiO$_2$/Ta 50/Pt 4/[Pt 8/CoFeSiB (x)]×5/Ta 50 (thickness unit: Angstrom) formed according to the present invention.

Referring to FIG. 5, it is understood that the coercivity and the saturation magnetization are varied with the variation of CoFeSiB thickness ($t_2$) in the Si/SiO$_2$/Ta 50/Pt 4/[Pt 8/CoFeSiB $t_2$]×5/Ta 50. When the thickness of the CoFeSiB layer is 6 Å or smaller, the coercivity increases because the perpendicular magnetic anisotropy increases with the increase of thickness. However, when the thickness of the CoFeSiB layer is greater than 6 Å, the coercivity of the perpendicular component decreases because a bulk anisotropy increases and the horizontal magnetic component increases correspondingly. In case of the saturation magnetization, the perpendicular magnetic anisotropy increases as the thickness of the perpendicular magnetic anisotropy layer increases on condition that the thickness of the CoFeSiB layer is 6 Å or smaller. However, it can be understood that the saturation magnetization does not increase any more when the thickness is greater than a predetermined value. It is preferable that the coercivity be less than 20 Oe in order that the multilayer may be used for the pMTJ. Thus, it is understood that the CoFeSiB layer has the thickness of 3 Å or smaller in case that Pt has a thickness of 8 Å.

According to the present invention, it is possible to provide a [Co$_{84.8}$Fe$_{5.96}$Si$_{6.24}$B$_{3.04}$/Pt]×n magnetic anisotropy multilayer having low coercivity, high perpendicular magnetic anisotropy, and low saturation magnetization which is similar to remanent magnetization. Accordingly, it is also possible to form a highly integrated magnetic memory. Here, Co$_{84.8}$Fe$_{5.96}$Si$_{6.24}$B$_{3.04}$~Co$_{70.5}$Fe$_{4.5}$Si$_{15}$B$_{10}$ can be used for the present invention.

While the invention has been shown and described with reference to certain preferred embodiments thereof, it will be understood by those skilled in the art that various changes in form and details may be made therein without departing from the spirit and scope of the invention as defined by the appended claims.

What is claimed is:

1. A perpendicular magnetic anisotropy multilayer comprising:
    a first Pt/CoFeSiB layer; and
    a second Pt/CoFeSiB layer formed on the first Pt/CoFeSiB layer,
    wherein the first and second Pt/CoFeSiB layers are perpendicular anisotropy magnetization films and the perpendicular magnetic anisotropy of the multilayer is about 5×10$^5$ erg/cm$^3$ to about 5×10$^6$ erg/cm$^3$.

2. The perpendicular magnetic anisotropy multilayer of claim 1, wherein the CoFeSiB layer has a composition of Co$_{84.8}$Fe$_{5.96}$Si$_{6.24}$B$_{3.04}$CoO$_{70.5}$Fe$_{4.5}$Si$_{15}$B$_{10}$.

3. The perpendicular magnetic anisotropy multilayer of claim 1, wherein a thickness ratio between the first Pt/CoFeSiB layer and the second Pt/CoFeSiB layer is 1:1.

4. The perpendicular magnetic anisotropy multilayer of claim 1, further comprising a third Pt/CoFeSiB layer formed on the second Pt/CoFeSiB layer.

5. The perpendicular magnetic anisotropy multilayer of claim 4, further comprising a fourth Pt/CoFeSiB layer formed on the third Pt/CoFeSiB layer.

6. The perpendicular magnetic anisotropy multilayer of claim 5, wherein a coercivity of the perpendicular magnetic anisotropy multilayer is 20 Oe or smaller.

7. The perpendicular magnetic anisotropy multilayer of claim 5, wherein the CoFeSiB layer has a thickness of 3 Å or smaller when the Pt layer has a thickness of 8 Å.

8. The perpendicular magnetic anisotropy multilayer of claim 5, wherein the Pt layer has a thickness of 14 Å or greater when the CoFeSiB layer has a thickness of 3 Å.

* * * * *